United States Patent [19]
Zepic et al.

[11] Patent Number: 5,819,651
[45] Date of Patent: Oct. 13, 1998

[54] CLAMPING-STRETCHING SYSTEM FOR STENCILS FOR SCREEN PRINTERS, WITH PRINTING TABLE FOR PC BOARDS

[75] Inventors: Janez Zepic, Ljubljana; Joze Stupar, Dvor Pri Zuzemberku; Kilijan Vizjak, Kranj, all of Slovenia

[73] Assignee: Zeltra, Podjetje Za Projektiranje, Proizvodnjo in Trgovino Elektrotehnike, Naklo, D.O.O., Naklo, Slovenia

[21] Appl. No.: 915,373

[22] Filed: Aug. 20, 1997

Related U.S. Application Data

[63] Continuation of Ser. No. 537,734, Oct. 12, 1995, abandoned.

[30] Foreign Application Priority Data

May 12, 1993 [SI] Slovenia .............................. P-9300252

[51] Int. Cl.$^6$ .................................................. B41F 15/36
[52] U.S. Cl. ......................................... 101/127.1; 101/126
[58] Field of Search ................................. 101/126, 127.1, 101/127, 128.1, 129

[56] References Cited

U.S. PATENT DOCUMENTS

| | | | |
|---|---|---|---|
| 3,172,358 | 3/1965 | Weiss | 101/126 |
| 3,303,777 | 2/1967 | Feier et al. | 101/127.1 |
| 3,485,165 | 12/1969 | Hughes | 101/127.1 |
| 3,486,441 | 12/1969 | Hillman et al. | 101/35 |
| 3,507,062 | 4/1970 | Moyer | 101/127.1 |
| 3,776,382 | 12/1973 | Wright et al. | 101/127.1 |
| 3,788,216 | 1/1974 | Lambert | 101/127.1 |
| 4,967,655 | 11/1990 | Holderegger et al. | 101/128.1 |
| 5,111,743 | 5/1992 | Umaba et al. | 101/127.1 |
| 5,308,645 | 5/1994 | Zachman et al. | 101/126 |
| 5,379,691 | 1/1995 | Hamu et al. | 101/127.1 |

FOREIGN PATENT DOCUMENTS

| | | | |
|---|---|---|---|
| 953973 | 9/1974 | Canada | 101/127.1 |
| 91 08 120 | 9/1991 | Germany . | |

*Primary Examiner*—Stephen R. Funk
*Attorney, Agent, or Firm*—Merchant, Gould, Smith, Edell, Welter & Schmidt

[57] ABSTRACT

The invention relates to a clamping-stretching system for stencils for screen printers, with a printing table for PC boards designed for applying colors, pastes, adhesives, etc., onto even surfaces of a print, preferably onto electronic PC boards with a stencil, which also allows through plating of holes of electronic PC boards. The clamping-stretching system of the stencil may be an element of a machine, or it may be fixed via a frame (4) to all types of printers. Stencils are clamped into it in an exchangable manner. A front crossbar (9) and a back crossbar (10) are guided in the side profiles of the frame which have a pressure bar at their lower part. The front crossbar (9) rests against the front wall (7) or aganist the front profile of the frame via at least one adjustment screw (5) and a cascade of disk springs (13). A universal printing table (3) with an exchangable reception plate has bore-holes into which spacers are inserted in such a manner that they can be pulled out, which support an exchangable reception plate, and a spacer which would get stuck in one of the holes in the reception plate or in a print, can be pulled out.

12 Claims, 7 Drawing Sheets

CLAMPING-STRETCHING SYSTEM FOR STENCILS FOR SCREEN PRINTERS, WITH PRINTING TABLE FOR PC BOARDS

This is a Continuation of application Ser. No. 08/537,734, filed Oct. 12, 1995 now abandoned.

BACKGROUND OF THE INVENTION

1. Field of the Invention

The invention relates to a clamping-stretching system for stencils for all types of screen printers, and machines with a universal printing table. The clamping-stretching system for stencils is intended for applying colors, pastes, adhesives, etc. onto even surfaces of a print, and for through plating, preferably of electronic printed circuit boards.

2. Description of the Proir Art

The usual way of applying colors, pastes, adhesives, etc. is by a screen printing technique. In this technique, a screen is fixed into a frame, the frame is clamped into a machine, and the machine approaches the frame to the print, while a squeegee presses the screen against the print and applies color, paste, adhesive, etc. over the screen. Each screen is clamped into its own frame and is not removed from its frame. Each screen, therefore, requires its own frame, which is expensive and impractical for storage. Metal stencils or stencils made from synthetic materials have been used more recently, although clamping into the frame in accordance with the prior art is performed in a manner similar to the screen printing technique. A screen is clamped into a frame, and a stencil is fixed onto the screen. There are several drawbacks to such a solution: problems with storing stencils together with the frames, stencils are difficult to clean, the stretching of screens is complicated, mechanical sensitivity, and there is no possibility to adjust the tension of a stencil. A known solution is to use a stencil clamping device, where on the one side the stencil is clamped into the frame, and on the other into a mobile bar, whose motion, and thereby stretching of the stencil, is pneumatic. Such a solution is complicated and requires a great number of frames for various types of machines. A solution of a clamping-stretching system for stencils with a machine which, in addition to applying colors, pastes, adhesives, etc. onto the even surfaces of prints, would also make it possible to apply pastes into the holes of a print, has not been known.

From U.S. Pat. No. 3,485,165 a clamping-stretching system is already known, where stencils are clamped onto a frame in exchangable manner. The marginal edge portions of the screen are looped back upon themselves, and these loops are inserted into grooves of the crossbars. Anchor pins are then inserted through the loops, and the pins lock the marginal edge portions of the screen to the crossbars, when these crossbars are retracted relative to all four frame sides.

Suction stenciling apparatus as described in U.S. Pat. No. 3,172,358 is intended for multi-color printing of porous sheet material. Reduced pressure is provided to hold the sheet material in place over the convex supporting means and to obtain a fluid-tight space between the stencil and the porous sheet material.

SUMMARY OF THE INVENTION

The invention as claimed is intended to remedy the drawbacks of stencil clamping and to ensure simple and fast clamping of various stencils into the same frame, whereby an easy and effective adjustment of the stencil's tension is ensured along its entire width. Harmless clamping, i.e. clamping without distortions, is provided whereby the frame with the clamping system is applicable for all types of machines in the screen printing or stencil printing technology. The invention additionally makes it possible to apply pastes into the holes of a print.

This is achieved through a clamping-stretching system for stencils for screen printers, preferably for machines with a universal printing table for PC boards, according to the main patent claim.

A major advantage of the invention as claimed is that it allows simple, fast and unambiguous clamping of different stencils of different sizes into the same universal frame, whereby easy and effective adjustment of its tension is ensured along its entire width, and thereby its harmless clamping, i.e. clamping without distortions, and additionally the application of pastes into the holes of the print is made possible.

DESCRIPTION OF THE DRAWINGS

The invention is described in drawings which illustrate several embodiments, in which.

DESCRIPTION OF THE ILLUSTRATED EMBODIMENTS

Figure 1:
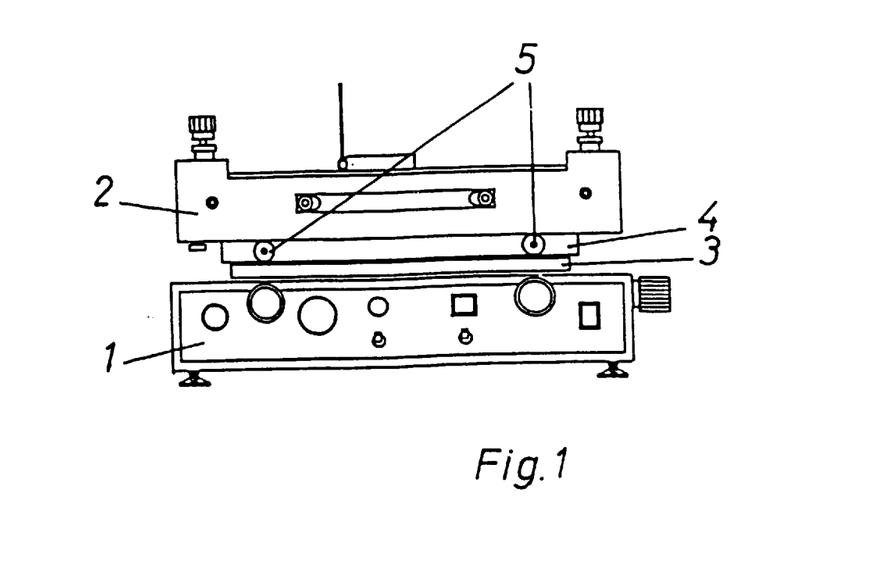
FIG. 1 is a front view of a screen printer in position for application.
Figure 2:
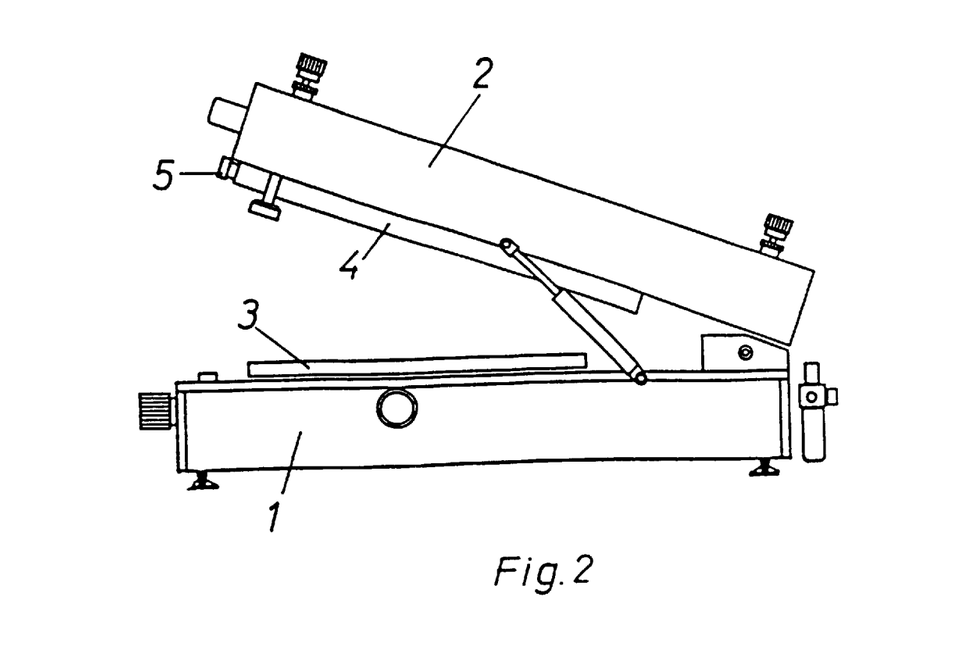
FIG. 2 is a side view of a screen printer in open position.
Figure 3:
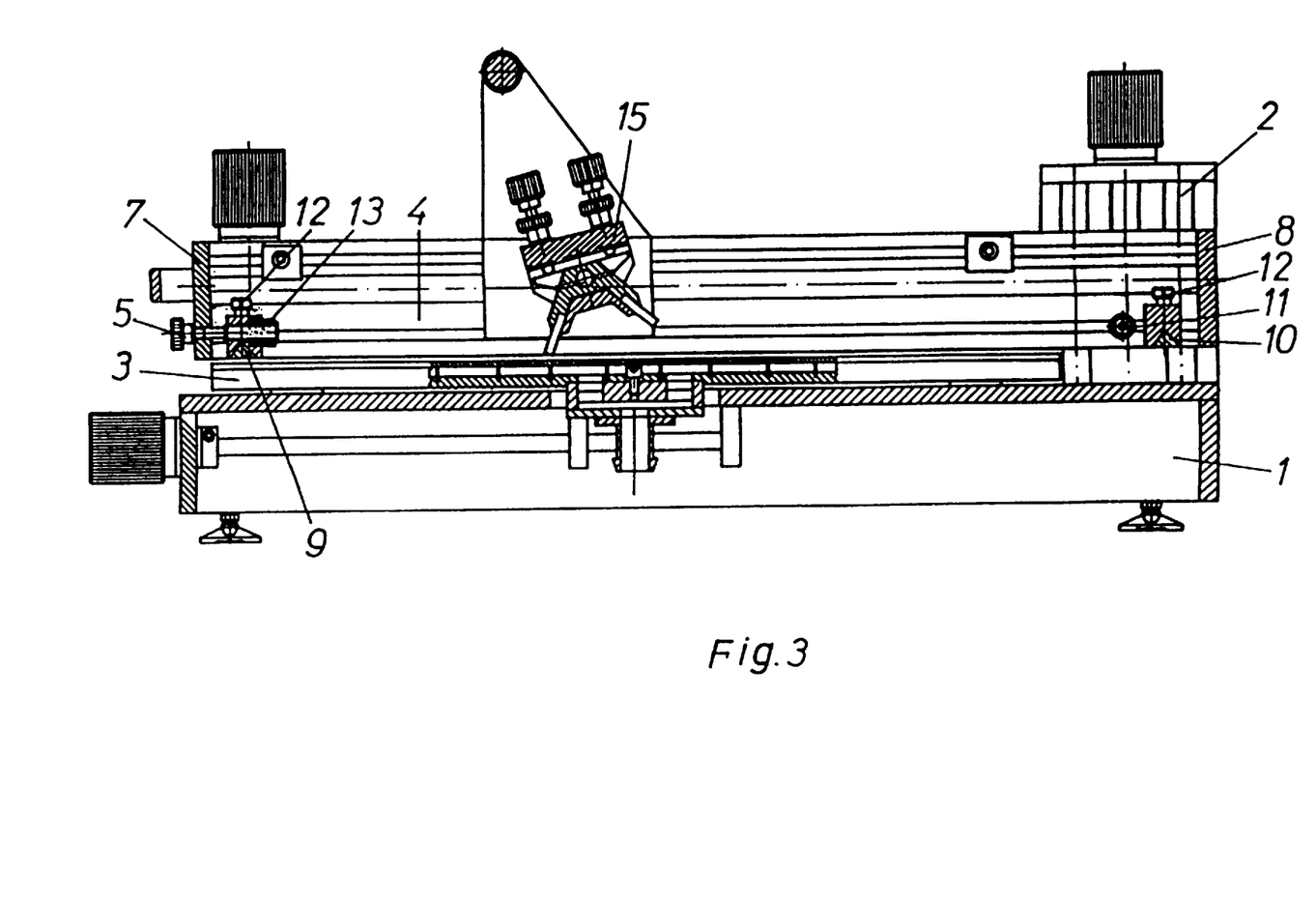
FIG. 3 is a cross-section of a machine with an embodiment of a clamping-stretching system for stencils, with a printing table for PC boards.

A printer for the production of PC boards of the screen printing machine type with a stencil with an angle opening system, serving as an embodiment of the invention, together with an embodiment of the invention of a clamping-stretching system for stencils with a printing table for PC boards according to FIGS. 1, 2 and 3, include a bottom part 1 and a top 2 being linked by bearings on the rear side in such a manner that the top 2 opens upward, thus allowing the introduction and withdrawal of prints. On the bottom part 1 there is a printing table 3 which is designed universally for different print sizes, different application procedures as well as different shifts, either longitudinal, transversal or rotational. The clamping of prints for the application of pastes into the holes of prints is carried out using vacuum. The points of fixture for the printing table 3 on the bottom part 1 and the connection to the vacuum pump are centrally located. On the lower side of the top 2 is a frame 4 of the clamping-stretching system for stencils, which is, according to the first embodiment illustrated in FIG. 3, a component part of the top 2, while in the second embodiment it is fixed to the top 2 in such a way that it can be removed.

The frame 4 of the clamping-stretching system for stencils according to the first embodiment illustrated in FIG. 3 consists of two side profiles 6 with grooves in which a front crossbar 9 and a back crossbar 10 are guided. The side profiles 6 are, according to this embodiment of the invention, the elements of the top 2 of the printer and are fixed to the front wall 7 and the back wall 8 of the top 2. The motion of the back bar 10 is limited by two adjustable screws 11 in the grooves of the side profiles 6, while the movement of the front bar 9 is limited by at least one regulation system made up of an adjustment screw 5 and a cascade of disk springs 13. The adjustment screw 5 rests at the one side against the front wall 7 and at the other via the cascade of disk springs 13 against the bar 9. Onto the bar 9 a stencil 14 is fixed by screws 12 in in a manner described further on. Through the adjustment screw 5 the required tension of the stencil 14 is achieved. The top 2 is open from the upper side, so that the stencil 14 and through it the print on the table 3 can be seen, whereby a precise positioning of the table 4 with the print with regard to the stencil 14 is made possible. By means of a squeegee 15 color, paste, adhesive, etc., is applied via the stencil 14 to the print.

Figure 4:
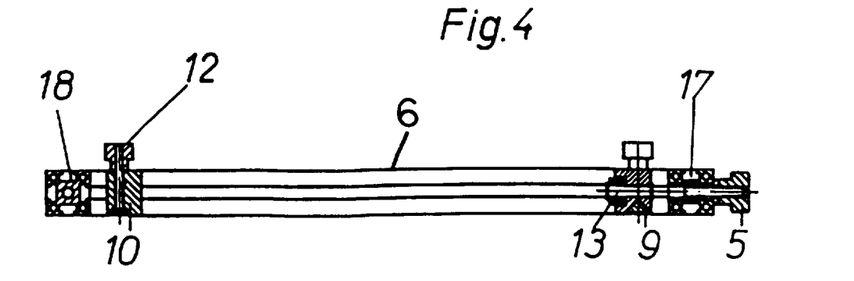
FIG. 4 is a cross-section of an embodiment of a clamping-stretching system.
Figure 5:
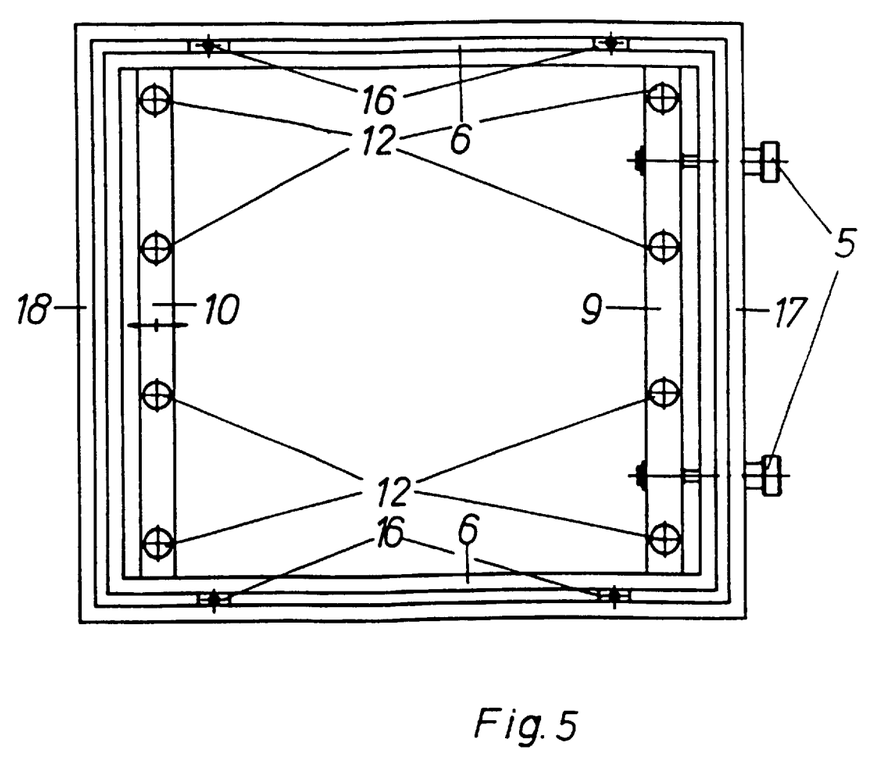
FIG. 5 is a floor plan of an embodiment of a clamping-stretching system.
Figure 6:
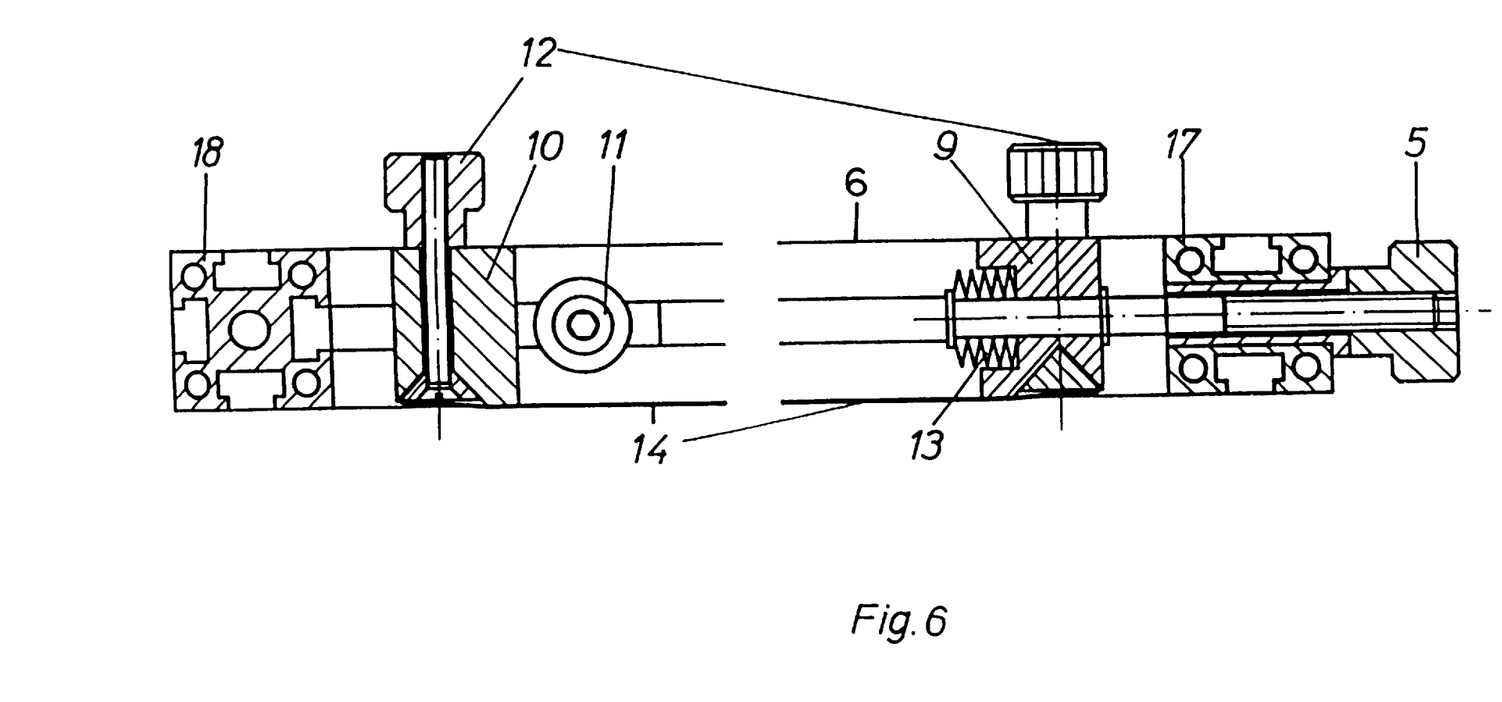
FIG. 6 is a cross-section of details of guiding and fixing crossbars.

The frame 4 of the clamping-stretching system for stencils, according to the second embodiment illustrated in FIGS. 4 and 5, is intended for removable fixation onto the lower side of the top 2. The frame 4 consists of two side profiles 6 which are fixedly joined with a front profile 17 and a back profile 18. As illustrated in FIG. 6, the two side profiles 6 have grooves in which the front crossbar 9 and the back crossbar 10 are guided. Both crossbars 9 and 10 serve for the clamping of the stencil. The movement of the back bar 10 is limited by two adjustable screws 11 in the grooves of the side profiles 6, while the movement of the front bar 9 is limited by at least one regulation system made up of an adjustment screw 5 and a cascade of disk springs 13. The adjustment screw 5 rests at the one side against the front profile 17, and at the other side via the cascade of disk springs 13 against the bar 9. A stencil 14 is fixed to the bars 9 and 10 by means of screws 12 in a manner described further on. The required tension of the stencil 14 is achieved using the regulation system. According to this embodiment of the invention, the frame 4 of the stencil is fixed in a removable way onto the lower side of the top 2, preferably by means of screws onto nuts 16, which are movable alongside the grooves of the side profiles 6.

Figure 7:
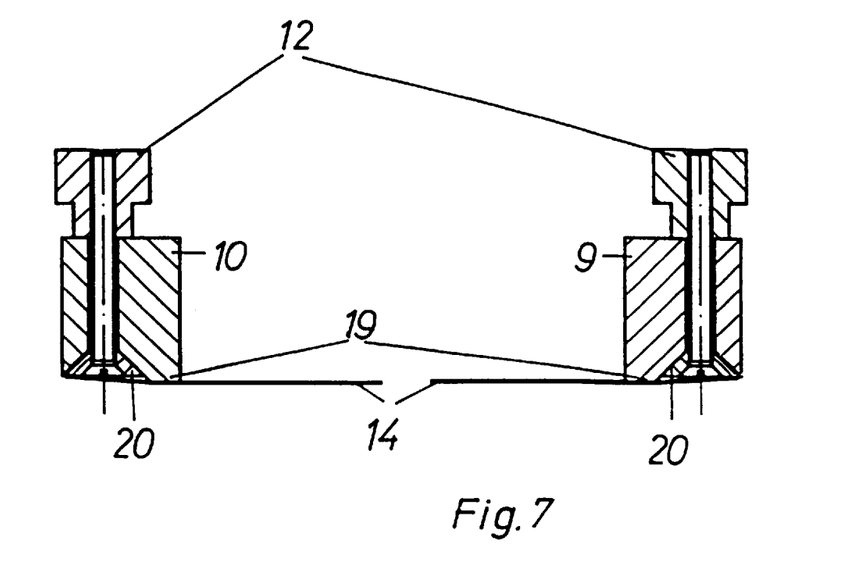
FIG. 7 is a cross-section of the first embodiment of clamping a stencil into a clamping-stretching system.
Figure 8:
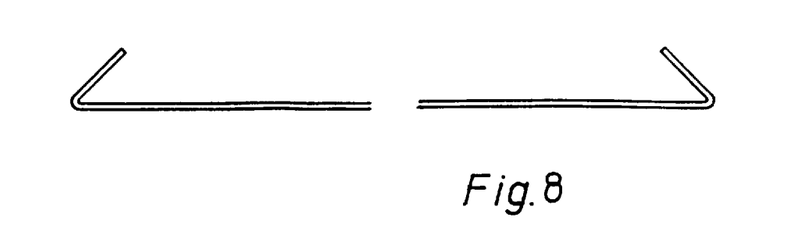
FIG. 8 is a cross-section of a stencil according to the first embodiment of a stencil.

The clamping of the stencil 14 between the front crossbar 9 and the back crossbar 10, according to the first embodiment of the invention with details illustrated in FIG. 7, is carried out in such a way that the stencil 14, which is shown as a detail in FIG. 8, fits behind a triangular pressure bar 20. Two triangular pressure bars 20 fit into corresponding triangular grooves along the of the crossbars 9 and 10, being fixed to these bars into the grooves by means of at least two screws 12. The crossbars 9 and 10 according to this embodiment of the invention have along the length of their lower, inner sides embossed fronts 19, which make it possible to precisely position the stencil 14. When the stencil 14 is fitted behind the two three-sided pressure bars 20, the screws 12 are tightened whereby the stencil 14 is fixed. In this embodiment of the invention the stencil 14 has its two transversal edges bent into an acute angle equal to the corresponding angle of the three-sided pressure bar 20, which is preferably 40–50 degrees.

Figure 9:
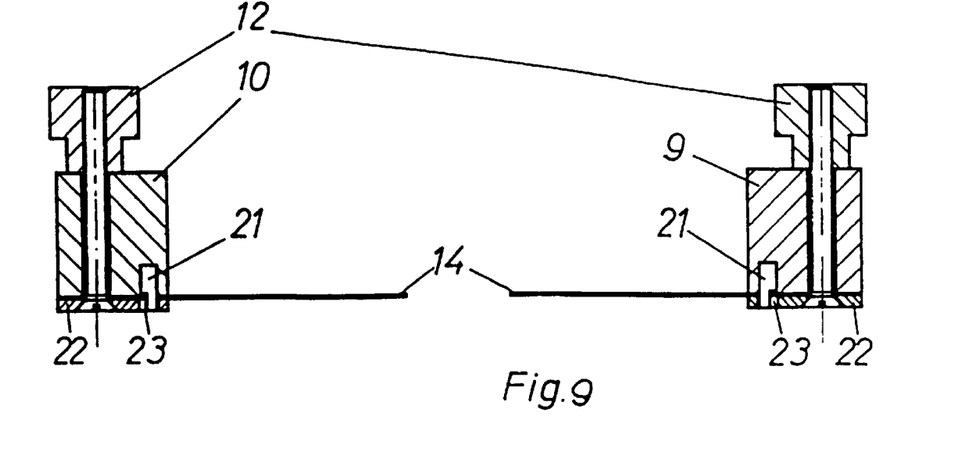
FIG. 9 is an illustration of the second embodiment of a clamping-stretching system.
Figure 10:
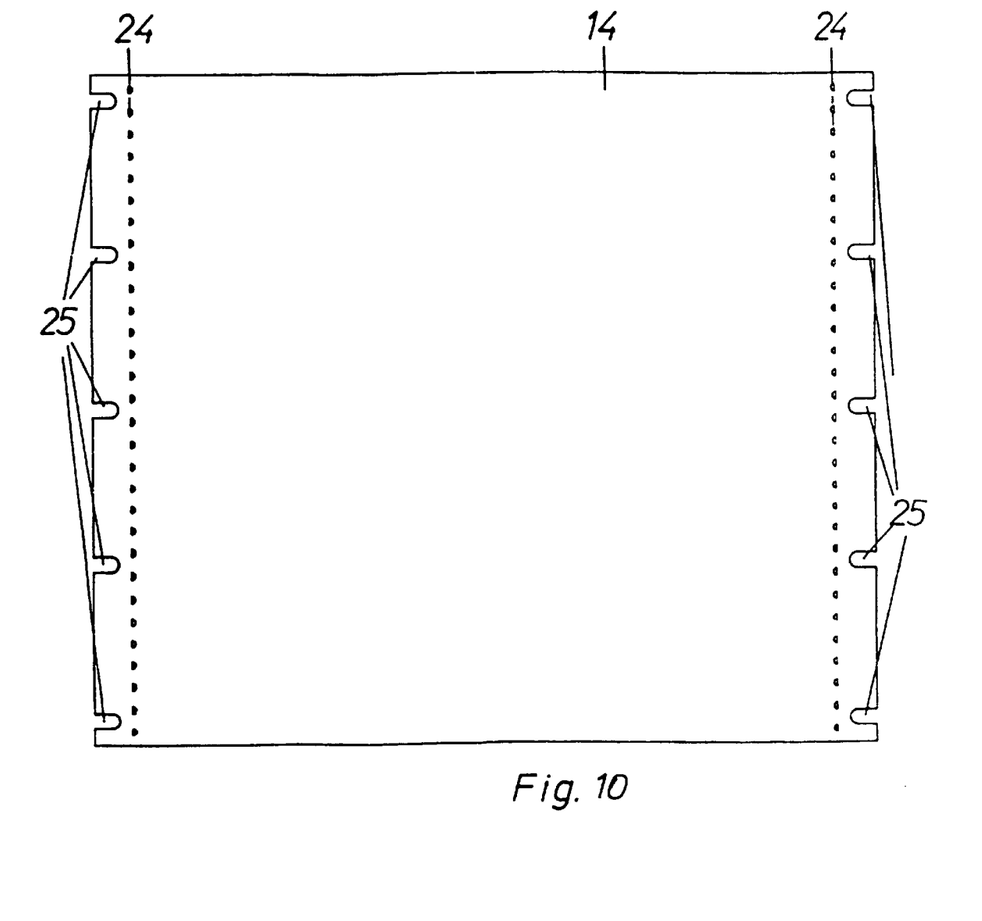
FIG. 10 is a plan according to the second embodiment of a stencil.

The clamping of the stencil 14 between the front crossbar 9 and the back crossbar 10, according to the second embodiment of the invention with details illustrated in FIG. 9, is carried out in such a way that the stencil 14, which is illustrated as a detail in FIG. 10, is fitted onto pins 21. Rectangular pressure bars 22 are fitted with holes or perforations 23 which correspond to the pins 21 and they fit along their entire length onto the crossbars 9 and 10 being fixed to them by at least two screws 12. According to this embodiment, the crossbars 9 and 10 have evenly arranged pins 21, along their respective lower, inner sides, each pin 21 having a cross-section in the part jutting out of the crossbars 9 and 10, which has the shape of an approximate semicircle. The rounded ends of the pins 21 are turned towards the transverse center line of the stencil 14. The stencil 14, which is illustrated in this embodiment in FIG. 10, has on its transversal edges guides 25 in the form of U-shaped notches made in such a way that the notches match the screws 12. Through an asymmetrical arrangement of the guides 25 a correct and unambiguous insertion of stencils is ensured. The stencil 14 is also fitted, along its transversal edges, with the perforations 24, the arrangement and the form of the perforations 24 fitting the arrangement and form of the pins 21. When the screws 12 are released, the pressure bars 22 move away from the crossbars 9 and 10, and the stencil 14 is positioned by the guides 25 so that its perforations 24 fit onto the pins 21. The screws 12 are then tightened and the stencil 14 is fixed.

Figure 11:
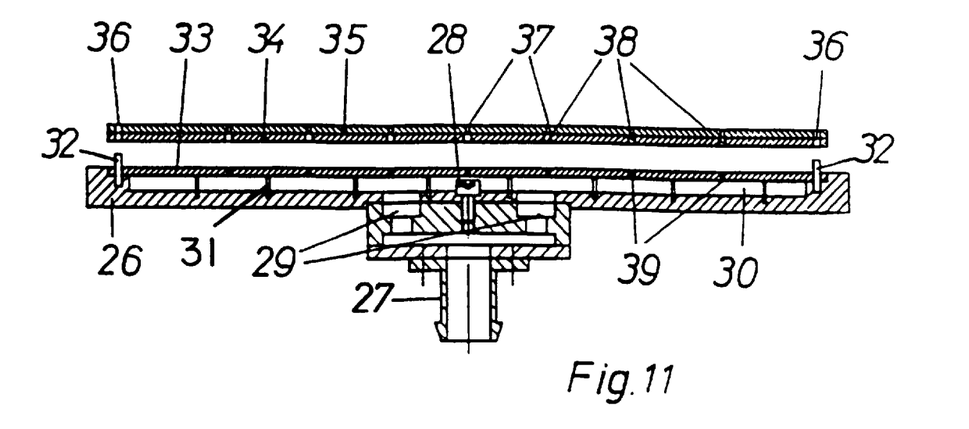
FIG. 11 is a cross-section of an embodiment of a printing table with spacers.
Figure 12:
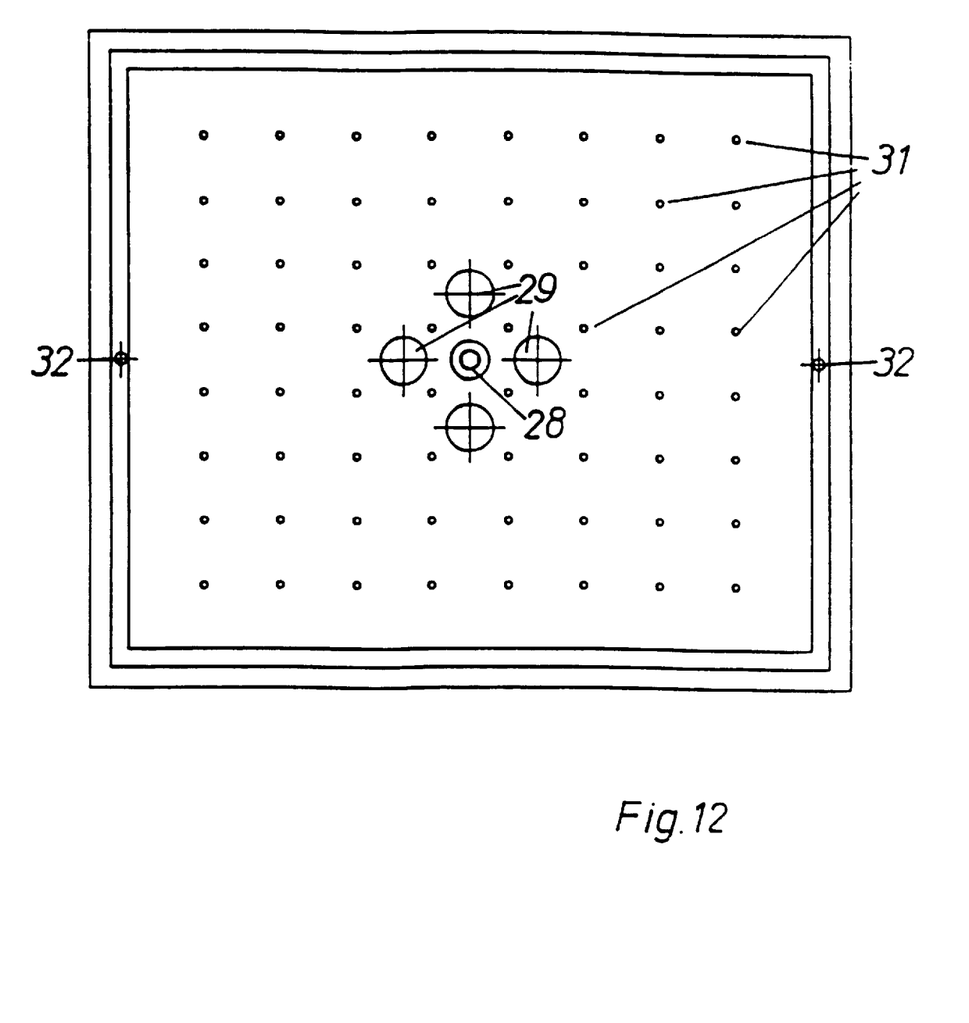
FIG. 12 is a plan of an embodiment of a printing table with spacers.

A printing table 3, an embodiment of which is illustrated in FIGS. 11 and 12, has, fixed to its body 26 with a screw 28, a vacuum connection 27. Through openings 29, which are centrically arranged around the screw 28, the vacuum is evenly dispersed inside a vacuum chamber 30. The vacuum chamber 30 is made up of the body 26 of the table 3 and a reception plate 33 which is placed on the body 26 in a removable manner. Accurate positioning of the plate 33 onto the table 3 is assisted by two exchangeable or, if necessary, removable pins 32 at the opposite edges of the table 3 and two corresponding bore-holes 39 on the plate 33. In order to protect the plate 33 from distortion by vacuum in the chamber 30, this is supported by spacers 31. The spacers 31 are of preferably of circular cross-section and are inserted into the corresponding bore-holes in the body 26 in such a way that they can be pulled out or, if necessary, removed. As illustrated in FIG. 12, the spacers 31 form a regular pattern. The length of the spacers 31 is such that the tips of the spacers 31 inserted into the bore-holes of the body 26 reach exactly to the lip on the body 26, onto which the plate 33 is laid. In the case where the printing table 3 serves for applying pastes for through plating of PC boards, the bore-holes 39 on the reception plate 33 are arranged exactly the same as the holes 37 on the print 35 which is to be through-plated, their diameter being, however, slightly bigger. When a larger series of prints is to be through-plated, an intermediate plate 34 is inserted between the print 35 and the plate 33, the bore-holes 38 of which are arranged exactly in the same manner as the holes 37 on the print 35 which is to be through-plated, their diameter being still slightly larger than that of the bore-holes 39 on the plate 33. The bore-holes 38 are intended for depositing excess paste that was sucked by the vacuum in the chamber 30 through the holes 37 of the print 35. This makes it possible to apply the paste on a larger quantity of prints without having to clean or remove the paste from the bore-holes 38 and 39. For smaller quantities of prints the intermediate plate 34 is not necessary. The size ratio between the holes 37, the bore-holes 39 and the bore-holes 38 is important, because paste has to be applied both on the walls of the holes 37 and on the vicinity of the holes 37 on the lower surface of the print 35, which ensures proper electrical contact. The print 35 and, if necessary, the intermediate plate 34 are laid and positioned on the table 3 in such a way that the two pins 32 fit into the bore-holes 36. The reception plate 33, the print 35 and, if necessary, the intermediate plate 34 are positioned so that the centers of the holes 37 and those of the bore-holes 39 and 38 correspond. Of course, also other bore-holes on the stencil 14 have to correspond to these centers, which is achieved by shifting the table 3. In order to assure a normal course of through-plating procedure of the holes 37, the holes 37 and all the corresponding bore-holes have to allow a free passage to the vacuum which sucks the paste applied with a squeegee 15 onto the stencil 14 into the holes 37. As the arrangement of the spacers 31 is predetermined with the corresponding bore-holes in the body 26, it may happen that one of the spacers 31 would get stuck in one of the bore-holes 39 and in this way disturb the action of the vacuum. For such a case it is important that the spacers 31 be inserted into the body 26 in such a manner that they can be pulled out at any time.

It is understood that the plate 33 is exchangeable and, with its arrangement of bore-holes, adaptable to different PC boards. In addition, it is understood that for some types of applications, the plate 33 has no bore-holes 39 and that no vacuum is required in the vacuum chamber 30, and that in this case prints are positioned only with the pins 32, or in some other known way, and that the fixing of prints is carried out in some other known way.

The procedure of applying colors, pastes, adhesives, etc. is as follows: the stencil 14 is clamped with screws 12 between the back crossbar 10 and the front crossbar 9, the back crossbar 10 is fixed with screws 11 to side profiles 6, and with one or several adjustment screws 5 the stencil is stretched and straightened. A reception plate 33 is laid on the table 3 which regulates vacuum and airflow, and its duration. If necessary, an intermediate plate 34 is placed on the plate 33, and then the print 35. The top 2 is set onto the bottom part 1 which brings the stencil 14 up to the print 35. Then color, paste or adhesive is applied with the squeegee 15. In the case of applying paste for through-plating PC boards, the vacuum sucks up the paste and applies it onto the walls of the holes 37, as well as onto its vicinity at the lower surface of the print 35. To the vicinity of the holes 37 on the upper surface of the print 35, the paste is applied directly with the squeegee 15 across the stencil 14.

We claim:

1. A clamping-stretching system to hold a stencil in a screen printer, the system comprising:
    a frame having side members and a front member;
    a moveable front crossbar guided by, and in direct contact with the side members to move along and between the side members, the front crossbar attached to the front member by an adjustment screw and at least one spring; and
    a back crossbar disposed between the side members, the front and back crossbars provided with respective front and back pressure bars to press the stencil against the front and back crossbars respectively so as to hold the stencil in place on the crossbars.

2. The system of claim 1, wherein the front and back pressure bars are triangular pressure bars and the front crossbar comprises a first embossed front on a lower, inner side facing the back crossbar, the back crossbar comprises a second embossed front on a lower, inner side facing the front crossbar, and lower surfaces of the front and back crossbars are each provided with a triangular groove to receive the respective triangular pressure bar fixed into the triangular groove with at least two screws, the triangular grooves and triangular pressure bars adapted to cooperatively grip edges of the stencil.

3. The system of claim 2, wherein the triangular pressure bars each have an angle ranging from 40° to 50° so as to bend the edges of the stencil at an angle ranging from 40° to 50°.

4. The system of claim 1, wherein the front and back crossbars are each provided with a set of pins inserted along inner edges of lower faces of the front and back crossbars and the pressure bars are each provided with a set of matching holes to receive corresponding pins.

5. The system of claim 4, wherein pins of the sets of pins have semicircular cross-sections and rounded portions of the cross-sections are oriented toward a transverse centerline of the stencil.

6. The system of claim 4, further comprising a stencil having perforations close to front and back edges to receive the pins and U-shaped notches along the front and back edges as positioning guides.

7. A screen printer for printing from a stencil, the printer comprising:
    a table having a body and a vacuum connection, removable spacers on the body supporting a reception plate so as to form a vacuum chamber between the reception plate and the body; and
    a clamping-stretching system including
        a frame having side members and a front member,
        a moveable front crossbar guided by, and in direct contact with, the side members to move along the side members, the front crossbar attached to the front member by an adjustment screw and at least one spring, and
        a back crossbar guided between the side members, the front and back crossbars provided with respective front and back pressure bars to press the stencil against the front and back crossbars respectively;
    wherein the clamping-stretching system is hingeably attached to the table so as to permit placement of the stencil against the table.

8. The printer of claim 7, wherein the front and back pressure bars are triangular pressure bars and the front crossbar comprises a first embossed front on a lower, inner side facing the back crossbar, the back crossbar comprises a second embossed front on a lower, inner side facing the front crossbar, and lower surfaces of the front and back crossbars are each provided with a triangular groove and the respective triangular pressure bar fixed into the triangular groove with at least two screws, the triangular grooves and triangular pressure bars adapted to cooperatively grip edges of the stencil.

9. The printer of claim 8, wherein the triangular pressure bars include angles ranging between 40° and 50° so as to bend the edges of the stencil at an angle ranging from 40° to 50°.

10. The printer of claim 7, wherein the front and back crossbars are each provided with a set of pins inserted along inner edges of lower faces of the front and back crossbars and the pressure bars are each provided with a set of matching holes to receive corresponding pins.

11. The printer of claim 10, wherein pins of the sets of pins have semicircular cross-sections and rounded portions of the cross-sections are oriented toward a transverse centerline of the stencil.

12. The printer of claim 10, further comprising a stencil having perforations close to front and back edges to receive the pins and U-shaped notches along the front and back edges as positioning guides.

* * * * *